United States Patent [19]

Cranford, Jr. et al.

[11] 4,004,164
[45] Jan. 18, 1977

[54] COMPENSATING CURRENT SOURCE

[75] Inventors: Hayden Clavie Cranford, Jr., Durham; Charles Reeves Hoffman, Raleigh, both of N.C.

[73] Assignee: International Business Machines Corporation, Armonk, N.Y.

[22] Filed: Dec. 18, 1975

[21] Appl. No.: 641,797

[52] U.S. Cl. .................. 307/297; 307/235 T; 330/22; 330/35

[51] Int. Cl.² .................. H03K 1/14; H03F 3/16; H03F 1/30; H03F 3/45

[58] Field of Search ....... 307/296, 297, 304, 235 T, 307/235 F; 330/35, 30 D, 22

[56] References Cited

UNITED STATES PATENTS

| | | | |
|---|---|---|---|
| 3,700,981 | 10/1972 | Masuhara et al. | 307/304 X |
| 3,813,595 | 5/1974 | Sheng | 330/35 X |
| 3,823,332 | 7/1974 | Feryszka et al. | 307/297 |
| 3,832,644 | 8/1974 | Nagata et al. | 330/35 X |
| 3,875,430 | 4/1975 | Prak | 307/297 |
| 3,943,380 | 3/1976 | Morgan et al. | 307/297 X |
| 3,947,778 | 3/1976 | Hsiao et al. | 330/35 X |

OTHER PUBLICATIONS

Hoffman, "Constant-Current Source for MOSFET Circuits", *IBM Tech. Discl. Bull.*, vol. 17, No. 8, p. 2391, Jan. 1975.
Atwood, "Field Effect Transistor Circuits", *IBM Tech. Discl. Bull.*, vol. 6, No. 9, pp. 91-93, Feb. 1964.
Freeman et al., "Level Shifting Circuit", *IBM Tech. Discl. Bull.*, vol. 18, No. 5, p. 1450, Oct. 1975.
Baitinger et al., "Constant-Current Source Network", *IBM Tech. Discl. Bull.*, vol. 13, No. 9, p. 2516, Feb. 1971.

*Primary Examiner*—John S. Heyman
*Assistant Examiner*—Larry N. Anagnos
*Attorney, Agent, or Firm*—Delbert C. Thomas

[57] ABSTRACT

The disclosed circuit is to provide a current source for use on a semiconductor chip having field effect transistors (FET) deposited therein to compensate for variations in the substrate voltage source. Analog type circuits when alone on a semiconductor chip or combined with digital type logic circuits are normally susceptible to disturbances in the bias voltage applied to the substrate of the chip. The obtaining of a uniform output response from an analog type circuit due to an input voltage change has heretofore required the use of off-chip precision voltage sources. Such expensive precision sources can be eliminated and normally variable (±15%) supplies can be used by providing an on-chip compensating current source which combines with other circuits to provide stable reference voltage levels on the chip for use by the analog circuits.

The compensating circuit comprises two depletion type field effect transistors (FET) in series between a higher voltage source and the substrate voltage, the FET connected to the higher voltage having its gate connected to the common node between the transistors and being in saturation and the lower voltage one having its gate connected to a ground voltage and being conductive in its linear region. An enhancement type transistor has its gate connected to the common node of the two depletion FETs and its source connected to the negative side of the substrate voltage source. By a proper selection of parameters, this circuit will pass a current varying inversely with changes in the substrate supply voltage to provide a compensated current source for other analog circuits. Representative circuits are shown for a stabilized voltage reference, for a differential amplifier current control and a combined circuit.

3 Claims, 2 Drawing Figures

COMPENSATING CURRENT SOURCE

The use of a number of functional circuits integrated on a single semiconductor chip is well known in digital data processing and because only the presence or absence of a signal is of importance, such circuits are operational over a range of input voltages varying ±10% or even ±15% from a nominal value. However, the use of FET's in semiconductor chips for analog type circuits, with or without accompanying digital type circuits has not been satisfactory due to different requirements. The needs of analog circuits for stable reference voltages and for constant voltage supplies in order to provide the desired input-output linearity or function has required expensive, high stability external supplies and off-chip connections to reference points. These requirements have made the use of FET integrated analog type circuits cost too much for conventional usages.

It is then an object of this invention to provide an analog circuit suitable for integration with other analog circuits on a semiconductor chip and capable of being used to regulate a control current over a tolerance range of an input voltage supply.

It is also an object to develop a circuit passing a current inversely related to the voltage across the circuit thereby providing an integrated analog circuit capability which is substantially independent of power supply variations.

It is another object to develop a circuit of this type in which the current voltage relationship can be designed to have any reasonable inverse relationship and to specify the equations and design parameters for such circuit.

A still further object is to disclose a combination of such a current source circuit with a differential amplifier circuit to enable a linear operation of said amplifier without alterations due to power supply variations within a tolerance range.

Other objects and features of the invention will become apparent in the following description of a preferred embodiment of the invention in conjunction with the accompanying drawings.

DESCRIPTION

Figure 1:
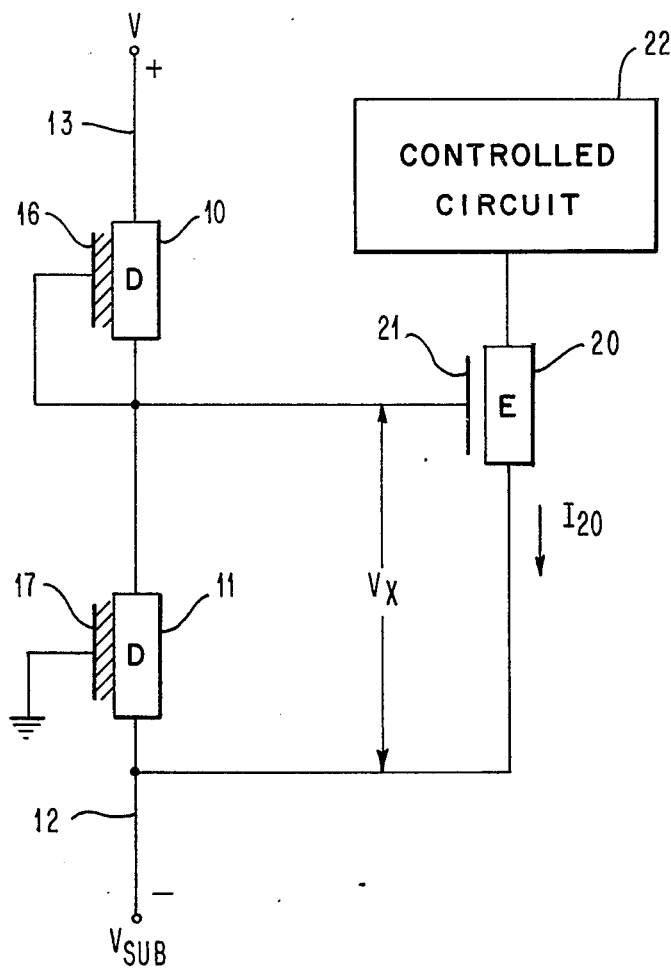
FIG. 1 is a diagram of the current control circuit of our invention.

The circuit of the invention shown in FIG. 1 gives a configuration that has the property of increasing or decreasing the current in a controlled circuit as the negative substrate voltage becomes more positive or more negative within its designed tolerance range. This current function may be combined with other networks to form the stable nodal voltages independent of normal power supply variations, The circuit comprises a pair of depletion type insulated gate field effect transistors (FETs) 10 and 11 connected in series between a source of a negative substrate voltage 12 and a more positive voltage terminal 13 which may be at a ground potential or at a more positive level. The gate 16 of the FET 10 is connected to the node between transistors 10 and 11 so that the transistor 10 is always in a saturated condition and acts as a source of a substantially constant current. Transistor 11 has its gate 17 connected to a ground voltage and with its source is connected to the substrate voltage supply 12, this FET will be operating in an approximately linear region. Since the gate-source voltage of this FET is the substrate voltage $V_{sub}$, any positive change of the substrate voltage will reduce the gate bias whereas a negative change will increase the bias. FET 11 will therefore show a resistance change having a function inversely proportional to changes in the substrate voltage and, in effect, acts like a variable resistance. Effectively, the voltage $V_x$ at the junction of the two FETs will, change in the same direction as the substrate voltage changes and because the voltage variations depend on the parameters used in depositing these devices, the variations; can be made to track with those in the substrate voltage.

A current control device comprising an FET 20 of an enhanced type has its source connected to the substrate voltage terminal 12 and its gate 21 connected to the junction of FETs 10 and 11 so that its gate bias is the value $V_x$. The FET 20 is then operating in its saturation region wherein the current through FET 20 will be controlled to be from a nominal value to an increased value as $V_{sub}$ becomes more positive and to a decreased value for negative changes in $V_{sub}$. This variable current through the controlled circuit 22 can be applied to maintain input voltage references or output bias voltages at a constant level.

Figure 2:
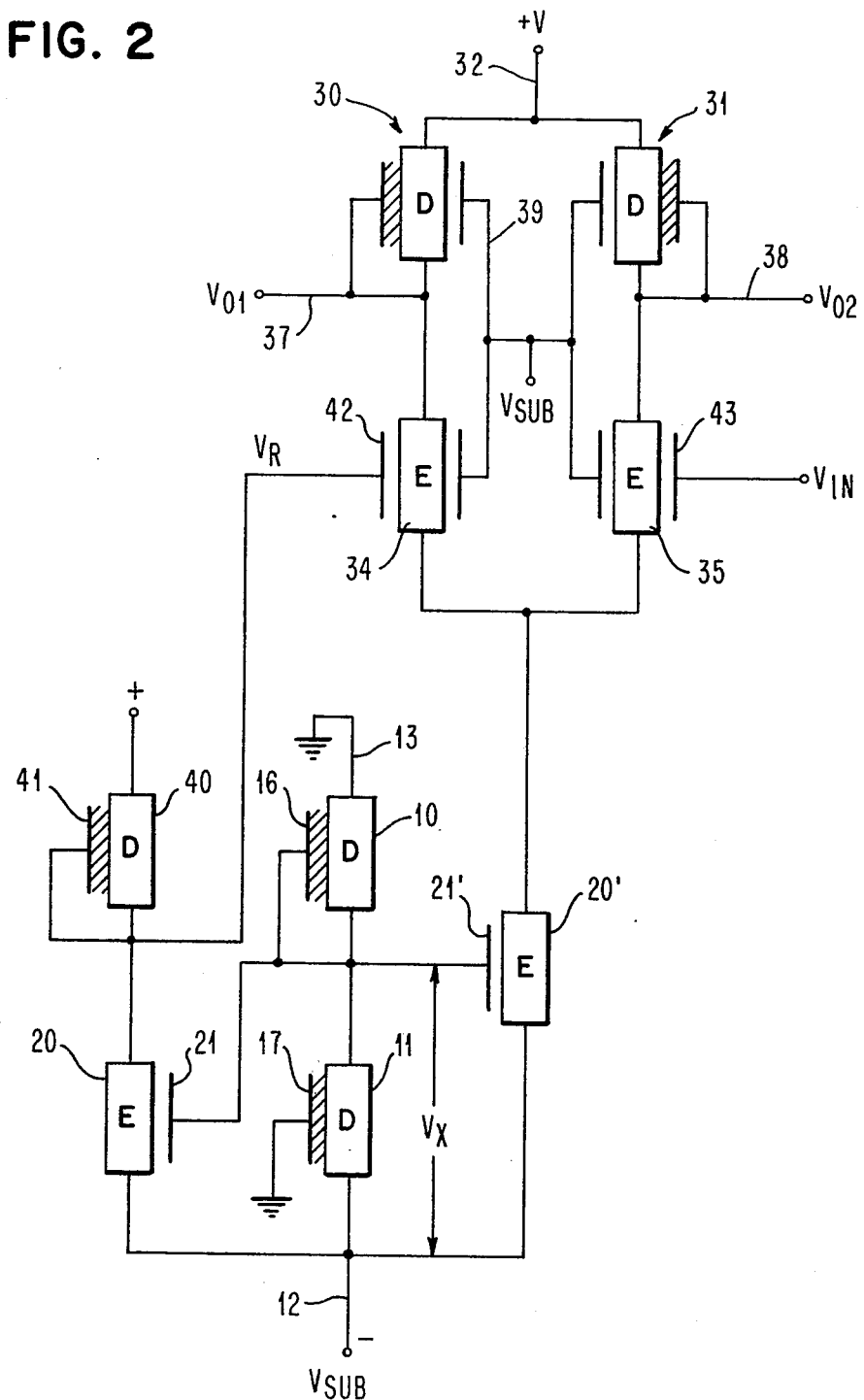
FIG. 2 is a diagram showing the control of both the reference level voltage and the current flow of a differential amplifier by the circuit of the invention.

FIG. 2 shows the use of such a current control circuit to provide a differential amplifier circuit with a stable reference voltage and to maintain the output voltage bias at a constant voltage during normal variations in the substrate voltage.

The differential amplifier per se comprises two parallel circuits, each consisting of a depletion type FET 30 or 31 having its drain connected to a positive voltage terminal 32 and each having its source connected to both its own gate and to the drain of an associated enhancement type FET 34 or 35. The sources of FETs 34 and 35 are connected together and to a current control device, here shown as the drain of the controlling FET 20' as described above. The nodes between the transistors 30, 34 and 31, 35 are connected to output terminals 37 and 38 to provide the true and complemental outputs corresponding to an input signal. The connection 39 to gate symbols at each FET is to indicate that the substrate voltage is applied to each of these FETs and that changes in the substrate voltage will affect the current flow in the FETs. The current control FET 20' will, as above noted, pass more current as the substrate voltage becomes more positive and, as will be shown later, will maintain the quiescent voltages $V_{o1}$ and $V_{o2}$ at a fixed level.

In using this type of differential amplifier, it is also necessary to supply a fixed reference voltage to set the zero point of the input signal. Such a fixed reference voltage is provided by a connection from a positive voltage source through a depletion type FET 40 having its source connected to its gate 41, to the gate 42 of FET 34 of the differential amplifier, and to the drain of current control FET 20. Both FETs 20 and 20' have their gates connected to the same control circuit of FETs 10 and 11 and other similar control FETs could also be controlled from this same junction point.

To determine the relationship between $I_{20}$ and $V_{sub}$ in the circuit of FIG. 1, the transistor currents are:

$$I_{10} = \lambda_{10}(V_{T10})^2 \quad (1)$$

$$I_{11} = 2\lambda_{11}(-V_{sub} - V_{T11} - \frac{V_x}{2})V_x \text{ and} \quad (2)$$

$$I_{20} = \lambda_{20}(V_x - V_{T20})^2 \quad (3)$$

wherein
$\lambda = \frac{1}{2}(u_oC_o)W/L$ for each device;
$u_o$ is the effective mobility of electrons in the channel
$C_o$ is the capacitance per unit area of the gate electrode
$W$ is the width of the conductive channel
$L$ is the length of the conductive channel
and wherein
$V_{Tx}$ is the threshold voltage of an FET $$V_T = \kappa_1 + K(V_s - V_{sub} + \psi)^{1/2} \quad (4)$$

in which
$K_1$ is a process dependent parameter whose value depends largely on the type of FET (enhancement or depletion) but is independent of applied voltages
$K$ is a second process dependent parameter independent of applied voltages
$V_s$ is the source to ground voltage
$V_{sub}$ is the substrate to ground voltage
$\psi$ is twice the Fermi level.
From $V_T$ and FIG. 1 we see that $$V_{T20} = K_{1_{20}} + K(\psi)^{1/2} \quad (5)$$

$$V_{T10} = K_{1_{10}} + K(V_x + \psi)^{1/2} \quad (6)$$

$$V_{T11} = K_{1_{11}} + K(\psi)^{1/2} \quad (7)$$

and since
(8) $I_{10} = I_{11}$ from equations (1) and (2)

$$\lambda_{10}(-V_{T10})^2 = 2\lambda_{11}(-V_{sub} - V_{T11} - \frac{V_x}{2})V_x \quad 9)$$

The partial derivative of equation 3) with respect to $V_{sub}$ is $$\frac{\delta I_{20}}{\delta V_{sub}} = 2\lambda_{20}(V_x - V_{T20})\left(\frac{\delta V_x}{\delta V_{sub}} - \frac{\delta V_{T20}}{\delta V_{sub}}\right) \quad 10)$$

Since from equation 5, $V_{T20}$ is independent of $V_{sub}$, $$\frac{\delta V_{T20}}{\delta V_{sub}}$$

is O and can be neglected, the partial derivative of equation (6) gives us $$\frac{\delta V_{T10}}{\delta V_{sub}} = \frac{K}{2(V_x + \psi)^{1/2}} \cdot \frac{\delta V_x}{\delta V_{sub}} = \lambda_{10}\frac{\delta V_x}{\delta V_{sub}} \quad 11)$$

Taking a partial derivative of equation 9, using equation 11 and solving for $$\frac{\delta V_x}{\delta V_{sub}}$$

gives the equation $$\frac{\delta V_x}{\delta V_{sub}} = V_x \left[(1 + \frac{2\lambda_{10}V_x}{-V_{T10}})(-V_{sub} - V_{T11} - \frac{V_x}{2}) - \frac{V_x}{2}\right]^{-1} \quad 12)$$

$$= V_x [f(V_x)]^{-1}$$

and (12) combined with (10) provides $$\frac{\delta I_{20}}{\delta V_{sub}} = 2\lambda_{20}(V_x - V_{T20})V_x [f(V_x)]^{-1} \quad 13)$$

Analysis of equations (12) and (13) by substitution of typical values for the right hand terms indicates that both $V_x$ and $I_{20}$ increase as $V_{sub}$ becomes more positive. As will be shown below, this is a desired behavior.

The application of the circuit of FIG. 1 to be the current source for the differential amplifier of FIG. 2 is shown by the following relationships.

The current through FET 30 is $I_{30} = \lambda_{30}(-V_{T30})^2$.

To determine the sensitivity of the output voltages $V_{o1}$ to changes in $V_{sub}$ we need the term $\delta V_{T30}/\delta V_{sub}$ and a partial differentiation of equation (4) provides:

$$\frac{\delta V_{T30}}{\delta V_{sub}} = K \cdot [(4(V_{o1} - V_{sub} + \psi)]^{1/2-}\left[\frac{\delta V_{o1}}{\delta V_{sub}} - 1\right] \quad 14)$$

$$= \alpha_{30}\left[\frac{\delta V_{o1}}{\delta V_{sub}} - 1\right]$$

Taking the partial derivative of the current expression for $I_{30}$ given above, substituting (14) and solving gives $$\frac{\delta V_{o1}}{\delta V_{sub}} = 1 - \left[\frac{\delta I_{30}}{\delta V_{sub}}\right]\left[2\lambda_{30}(-V_{T30}\alpha_{30})\right]^{-1} \quad 15)$$

In order for $V_{o1}$ to be constant as $V_{sub}$ varies, we require $$\frac{\delta V_{o1}}{\delta V_{sub}}$$

to be equal to 0 and therefore $$\frac{\delta I_{30}}{\delta V_{sub}} = 2\lambda_{30}(-V_{T30})\alpha_{30} \quad 16)$$

gives the desired behavior for $I_{30}$ as $V_{sub}$ changes.

This tells us that since $V_{T30}$ is a negative number, $I_{30}$ should increase as $V_{sub}$ becomes more positive. By proper adjustment of the design parameters controlling the value of $V_x$ as indicated in equation 13, the current variations of FET 20' can be made to match the required change given by (16), thus holding the quiescent output voltage of the differential amplifier constant and independent of changes in $V_{sub}$.

For the other indicated use of the circuit of the invention, i.e., the maintaining of a constant reference voltage, the following equations apply. For equation (16) voltage, the following equations apply. From equation (16) applied to FET 40, the current change necessary to maintain a constant $V_R$ is $$\frac{\delta I_{40}}{\delta V_{sub}} = 2\lambda_{40}(-V_{T40}) \alpha_{40} \qquad 17)$$

Using the equation (10) value for $$\frac{\delta I_{20}}{\delta V_{sub}}$$

and remembering $$\frac{\delta V_{T20}}{\delta V_{sub}}$$

is zero, the current variation in FET 20 can be set equal to (17) giving $$2\lambda_{20}(V_x - V_{T20}) \frac{\delta V_x}{\delta V_{sub}} = 2\lambda_{40}(-V_{T40}) \alpha_{40} \qquad 18)$$

$$\frac{\delta V_x}{\delta V_{sub}} = \frac{\lambda_{40}(-V_{T40}) \alpha_{40}}{\lambda_{20}(V_x - V_{T20})} \qquad 19)$$

By noting that $I_{40} = I_{20}$ and using equations (3) and $I_{40} = \lambda_{40}(-V_{T40})^2$ the $\lambda$'s can be eliminated from (19) giving $$\frac{\delta V_x}{\delta V_{sub}} = \left(\frac{V_x - V_{T20}}{-V_{T40}}\right)^{\alpha_{40}} \qquad 20)$$

By selecting the circuit parameters for FET 20 and FET 40 to satisfy equation 20, the condition that $V_R$ be insensitive to changes in $V_{sub}$ can be met so that the reference voltage of the differential amplifier will be held steady.

The above description of the preferred embodiment of our invention is not to be taken as a limitation on the scope of the invention which is defined in the following claims.

What is claimed is:
1. A field effect transistor circuit suitable for incorporation on a semiconductor substrate with other field effect transistor circuits of an analog type and in which substrate a biasing voltage is subject to variations within a tolerance range, said circuit acting to compensate for voltage changes in the inputs or outputs of said other circuits due to variations in said substrate biasing voltage and comprising:
an FET depletion type of transistor deposited in said substrate and having its source connected to the negative terminal of said substrate voltage and its gate connected to a ground level reference voltage and thereby biased in its linear region of operation,
a second depletion type transistor deposited in said substrate and having its source connected to the drain of said first FET depletion type transistor and with its drain connected to a voltage source which is positive with respect to said substrate voltage, and having its gate connected to its source or to a voltage point having a voltage lower than said source and varying with said substrate voltage whereby said second depletion transistor is biased in its saturation region,
a deposited current control device of the enhanced type of field effect transistor having its source connected to said negative terminal of said substrate voltage and its gate connected to the common node between said first and second type transistors and
a current biased circuit connected to the drain of said enhancement type transistor whereby, the current in said biased circuit is inversely related to the magnitude of said substrate voltage.

2. A circuit as set out in claim 1 in which said current biased circuit is a reference voltage source comprising:
a third depletion type field effect transistor deposited in said substrate and having its source and gate connected to said drain of said enhancement transistor and to a constant voltage reference output terminal and its drain connected to a source of positive potential, said third depletion type field effect transistor being so proportioned that the voltage at its source is independent of voltage changes within the tolerance limits of said substrate voltage.

3. A circuit as set out in claim 1 in which said current biased circuit is a differential amplifier arrangement having an output whose quiescent voltage normally varies with changes in said substrate voltage and in which circuit said deposited current control device is proportioned to pass a current which maintains the output bias level of said differential amplifier at a constant value during substrate voltage changes within a tolerance range of said substrate voltage.

* * * * *